(12) United States Patent
Bhattacharya et al.

(10) Patent No.: US 7,057,545 B1
(45) Date of Patent: Jun. 6, 2006

(54) SEMICONDUCTOR RESISTANCE COMPENSATION WITH ENHANCED EFFICIENCY

(75) Inventors: Dipankar Bhattacharya, Macungie, PA (US); Makeshwar Kothandaraman, Whitehall, PA (US); John C. Kriz, Palmerton, PA (US); Bernard L. Morris, Emmaus, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 11/170,127

(22) Filed: Jun. 29, 2005

(51) Int. Cl.
*H03M 1/12* (2006.01)

(52) U.S. Cl. ..................... 341/155; 341/154

(58) Field of Classification Search ......... 341/126–155
See application file for complete search history.

(56) References Cited

U.S. PATENT DOCUMENTS 6,788,042 B1 * 9/2004 Nazarian et al. ............ 341/153
6,894,550 B1 * 5/2005 Trosa et al. ................. 327/234

* cited by examiner

*Primary Examiner*—Lam T. Mai

(57) ABSTRACT

A semiconductor resistor circuit having a controllable resistance associated therewith includes a plurality of resistor segments connected in a series and/or parallel configuration. The resistor circuit further includes a plurality of switches controlling connection of respective ones of the resistor segments to the resistor circuit, to thereby selectively control a resistance of the resistor circuit in response to respective control signals presented to the switches. The resistor circuit is selectively controllable in discrete resistance intervals, the resistance intervals being unequal to one another. The resistor segments have resistance values that are selected such that a percentage resistance variation across each of the respective resistance intervals as a function of process, voltage and/or temperature conditions to which the resistor circuit is subjected is substantially the same.

20 Claims, 4 Drawing Sheets

SEMICONDUCTOR RESISTANCE COMPENSATION WITH ENHANCED EFFICIENCY

FIELD OF THE INVENTION

The present invention relates generally to semiconductor devices, and more particularly relates to techniques for improving resistance compensation efficiency of a semiconductor resistor.

BACKGROUND OF THE INVENTION

Many integrated circuits (ICs), including, for example, input/output (IO) buffers, etc., employ resistance compensation circuitry for compensating output termination resistances associated with the ICs. The resistance compensation circuitry generally attempts to minimize an overall variation of resistance as a function of process, supply voltage and/or temperature (PVT) conditions to which the ICs may be subjected. This in turn ensures proper matching of source termination resistances in the ICs to transmission line impedances of corresponding cables, backplanes, printed circuit board connections, etc., which may be coupled to the ICs.

A conventional resistance compensation circuit employs a parallel and/or series resistor switching scheme that is controlled by monitoring the resistance of a reference resistor for adjusting the resistance value of a compensated resistor comprising a plurality of resistor segments. The resistor segments forming the compensated resistor are typically selected to be of equal resistance value relative to one another. The overall resistance value of the compensated resistor is commonly adjusted by switching one or more resistor segments into or out of the circuit as required to match a desired impedance.

FIG. 1A is a schematic diagram depicting a compensated termination resistor circuit employing a parallel switching scheme to switch resistor segments R0, R1, R2 and R3, which are all of equal value relative to one another. Switches SW0, SW1, SW2 and SW3, used to selectively connect corresponding resistor segments R0, R1, R2 and R3, are controlled by control signals VSW0, VSW1, VSW2 and VSW3, respectively. The control signals VSW0, VSW1, VSW2, VSW3, are selected so as to provide equally spaced switching intervals for the resistor segments. However, having equally spaced resistance intervals does not typically minimize the overall resistance tolerance as a function of PVT conditions to which the circuit may be subjected. Moreover, this approach generally requires a higher number of intervals in order to realize a particular resistance tolerance, and is thus less efficient than certain inventive compensation methodologies, as will be described herein.

Accordingly, there exists a need for techniques for improving the efficiency of resistance compensation circuitry, which does not suffer from one or more of the problems exhibited by conventional resistance compensation methodologies.

SUMMARY OF THE INVENTION

The present invention meets the above-noted need by providing, in an illustrative embodiment, techniques for improving an efficiency of resistance compensation of a semiconductor resistor circuit, thereby reducing the number of resistance intervals needed to achieve a desired effective tolerance of the resistor circuit. Rather than employing equally spaced resistance intervals, as is traditionally done, resistance interval widths are geometric so as to yield substantially equal resistance tolerances across all intervals. This can be accomplished, for example, by making the intervals narrower toward a lower end of the variation range where tolerance is inherently larger, and making the intervals wider toward a higher end of the range where tolerance is inherently smaller. Using the geometric interval spacing methodology of the present invention requires less intervals to meet a desired tolerance, and thus significantly reduces silicon area and circuit complexity, compared to traditional resistance compensation methodologies.

In accordance with one aspect of the invention, a semiconductor resistor circuit having a controllable resistance associated therewith includes a plurality of resistor segments connected in a series and/or parallel configuration. The resistor circuit further includes a plurality of switches controlling connection of respective ones of the resistor segments to the resistor circuit, to thereby selectively control a resistance of the resistor circuit in response to respective control signals presented to the switches. The resistor circuit is selectively controllable in discrete resistance intervals, the resistance intervals being unequal to one another. The resistor segments have resistance values that are selected such that a percentage resistance variation across each of the respective resistance intervals as a function of process, voltage and/or temperature conditions to which the resistor circuit is subjected is substantially the same.

These and other features and advantages of the present invention will become apparent from the following detailed description of illustrative embodiments thereof, which is to be read in connection with the accompanying drawings.

DETAILED DESCRIPTION OF THE INVENTION

The present invention will be described herein in the context of an illustrative semiconductor resistance compensation circuit. It should be understood, however, that the techniques of the present invention are not limited to this or any particular resistance compensation circuit. Rather, the invention is more generally applicable to techniques for improving resistance compensation efficiency of a semiconductor resistor, thereby reducing the number of resistance intervals needed to achieve a desired effective tolerance of the resistor. Furthermore, although the present invention is described herein with specific reference to a complementary metal-oxide-semiconductor (CMOS) fabrication process, it is to be understood that the invention is not limited to such a fabrication process, and that other suitable fabrication processes (e.g., bipolar, BiCMOS, etc.), may be similarly employed, as will be understood by those skilled in the art.

Figure 1A:
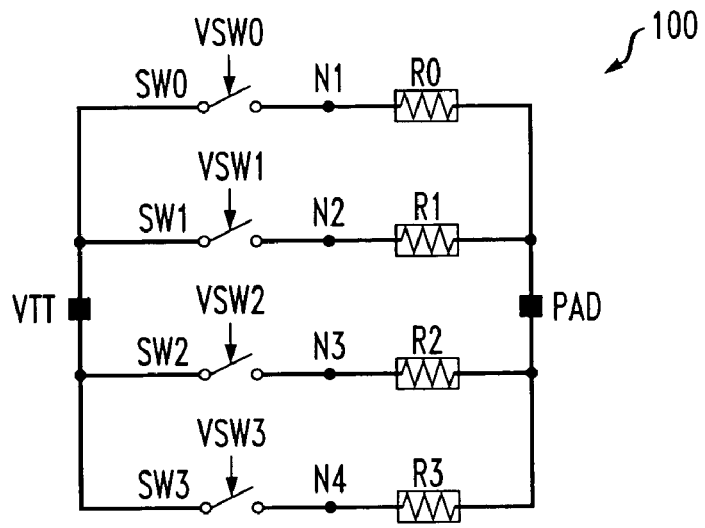
FIG. 1A is a schematic diagram depicting a compensated resistor circuit employing a parallel switching arrangement, in which the techniques of the present invention may be implemented.
Figure 1B:
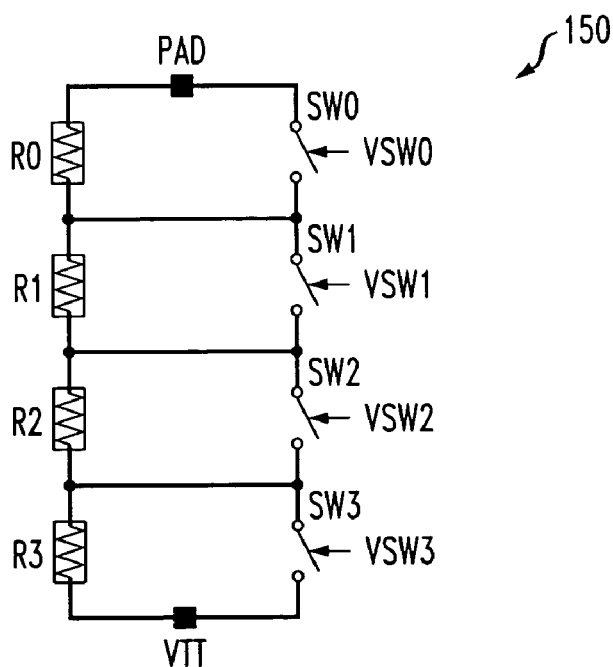
FIG. 1B is a schematic diagram depicting a compensated resistor circuit employing a series switching arrangement, in which the techniques of the present invention may be implemented.

FIG. 1A is a schematic diagram illustrating an exemplary compensated resistor circuit 100 comprising a plurality of resistor segments, R0, R1, R2 and R3, connected in parallel with one another via respective series connected switches, SW0, SW1, SW2 and SW3. Specifically, a first terminal of each of the resistor segments R0, R1, R2, R3, is connected to a first common node, PAD, of the compensated resistor circuit 100, a second terminal of R0 is connected to a first terminal of switch SW0 at node N1, a second terminal of R1 is connected to a first terminal of switch SW1 at node N2, a second terminal of R2 is connected to a first terminal of switch SW2 at node N3, and a second terminal of R3 is connected to a first terminal of switch SW3 at node N3. A second terminal of each of the switches SW0, SW1, SW2, SW3, is connected to a second common node, VTT, of the compensated resistor circuit 100. It is to be understood that the present invention is not limited to the number of resistor segments and/or the connection arrangement shown. For instance, FIG. 1B depicts an exemplary compensated resistor circuit 150 in which the plurality of resistor segments R0, R1, R2, R3 are connected together in a series arrangement, and corresponding switches SW0, SW1, SW2, SW3, are each connected in parallel across a respective resistor segment. Resistor segments may be alternatively arranged in a combination of series and parallel connections, as will be understood by those skilled in the art.

Each of the switches SW0, SW1, SW2, SW3, is preferably operative to selectively connect or disconnect its corresponding resistor segment R0, R1, R2, R3, from or to the circuit in response to a control signal, VSW0, VSW1, VSW2 and VSW3, respectively. The control signals may be generated by monitoring the resistance of a reference resistor, as will be described in further detail below. As the overall resistance of the termination resistor circuit 100 changes with PVT conditions, one or more resistor segments may be switched in or out of the resistor circuit so as to maintain a desired tolerance of the resistor circuit. The number of resistor segments required will be a function of the desired effective tolerance of the termination resistor circuit 100, among other factors. For example, as the desired effective tolerance of the termination resistor circuit 100 increases, the number of resistor segments necessary to achieve such a tolerance will increase accordingly.

Although shown symbolically in the figure as physical switches, one or more of the switches SW0, SW1, SW2, SW3 may comprise, for example, a metal-oxide-semiconductor (MOS) device functioning as a transmission gate switch, although alternative switching circuitry is similarly contemplated by the invention. MOS switches, in general, are well known by those skilled in the art, as described, for example, in the text PHILLIP E. ALLEN & DOUGLAS R. HOLBERG, CMOS ANALOG CIRCUIT DESIGN 113–123 (2d ed., Oxford University Press 2002), the disclosure of which is incorporated herein by reference. Consequently, a detailed discussion of MOS switches will not be presented herein.

Figure 2:
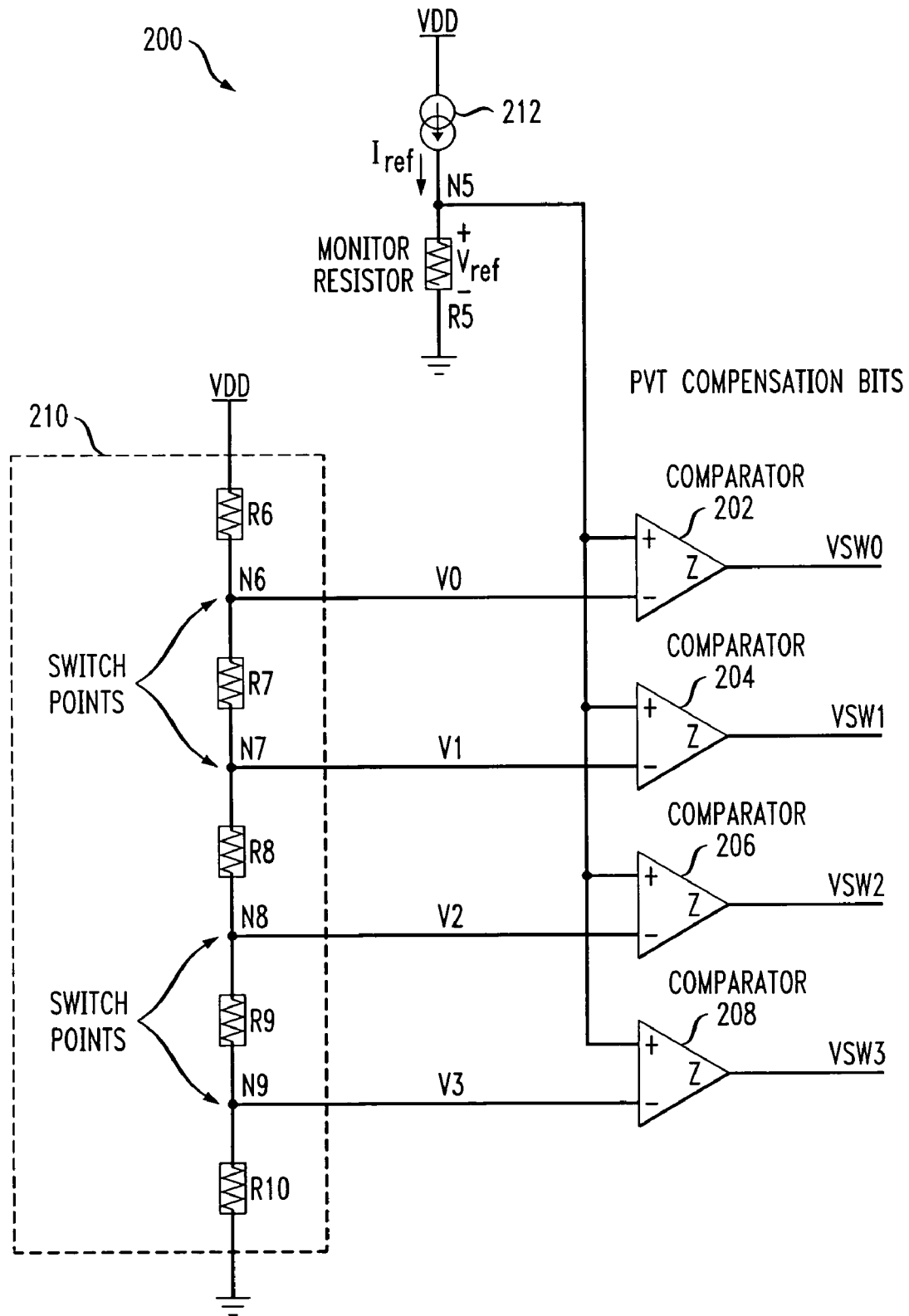
FIG. 2 is a schematic diagram depicting an exemplary voltage generator circuit, formed in accordance with one embodiment of the invention.

FIG. 2 is a schematic diagram depicting an exemplary voltage generator circuit 200 which may be employed to generate the control signals VSW0, VSW1, VSW2, and VSW3, utilized by the termination resistor circuit 100 shown in FIG. 1, in accordance with one embodiment of the invention. The control signals VSW0 through VSW3 are preferably operative to selectively switch the respective resistor segments R0 through R3 as a function of PVT conditions. It is to be appreciated, however, that the invention is not limited to the particular voltage generator circuit arrangement shown. An illustrative resistance compensation circuit may comprise, for example, the compensated termination resistor circuit 100, shown in FIG. 1, in conjunction with the voltage generator circuit 200.

The voltage generator circuit 200 preferably comprises a plurality of comparators, 202, 204, 206 and 208, each comparator having at least first and second inputs for receiving two or more voltage levels to be compared, and an output for generating a given one of the control signals VSW0, VSW1, VSW2, VSW3, respectively. A first input of each of the comparators 202, 204, 206, 208, which may be a non-inverting (+) input, is preferably connected to a voltage source at node N5 which supplies a voltage, Vref, which varies as a function of PVT conditions. The voltage source may comprise, for example, a monitor resistor, R5, and a constant current source 212 connected to a first terminal of resistor R5 at node N5 for supplying a substantially constant current, Iref. A second terminal of resistor R5 connects to a first voltage source supplying a first voltage, which may be ground. The voltage Vref generated at node N5 will be equal to Iref×R5. Assuming that the current Iref is substantially constant over PVT variations, the voltage Vref generated at node N5 will vary as a function of PVT conditions to which resistor R5 is subjected. Voltage Vref, which may be referred to as a PVT-dependent voltage, is used by the comparators to generate the control signals VSW0 through VSW3 for performing resistance compensation.

The control signals VSW0 through VSW3 are preferably digital outputs (e.g., logic high or logic low) which may be considered PVT compensation bits. The PVT compensation bits, together, form a digital code word (e.g., binary, thermometer, etc.) indicative of an amount of PVT variation in the voltage generator circuit 200. The number of PVT compensation bits in the output digital word corresponds to the number of resistor segments in the termination resistor circuit 100 (see FIG. 1) that are to be switched. In the illustrative embodiment shown in FIGS. 1 and 2, four resistor segments, and thus four PVT compensation bits, are employed, as represented by control signals VSW0, VSW1, VSW2, VSW3, although the present invention is not limited to any particular number of bits.

Preferably, the monitor resistor R5 is substantially matched (e.g., in terms of material type, physical proximity, etc.) to the segments R0, R1, R2, and R3 in the termination resistor circuit 100 of FIG. 1. In this manner, any PVT changes detected in monitor resistor R5 will more closely track PVT changes in the termination resistor circuit. Accordingly, the resistance value of the termination resistor circuit 100 (see FIG. 1) can be more accurately controlled so as to achieve a desired tolerance over PVT variations. In a preferred embodiment of the invention, resistor segments R0, R1, R2, R3 (see FIG. 1), and monitor resistor R5 are comprised of polysilicon material, although the invention contemplates that alternative materials (e.g., diffused resistor, etc.) may be similarly employed.

The voltage generator circuit 200 further comprises a reference source 210 providing a plurality of substantially constant voltages, V0, V1, V2 and V3, to the respective comparators 202, 204, 206, 208. Specifically, a second input of each comparator, which may be an inverting (−) input, preferably receives a corresponding one of the voltage levels. For instance, the second input of comparator 202 preferably receives voltage V0, the second input of comparator 204 receives voltage V1, the second input of comparator 206 receives voltage V2, and the second input of comparator 208 receives voltage V3.

Reference source 210 may comprise, for example, a resistor string including a plurality of resistors, R6, R7, R8, R9 and R10, connected in series between ground and a second voltage source supplying a second voltage, which may be VDD. Specifically, a first terminal of resistor R6 preferably connects to VDD, a second terminal of R6 is connected to a first terminal of resistor R7 at node N6, a second terminal of R7 is connected to a first terminal of resistor R8 at node N7, a second terminal of R8 is connected to a first terminal of resistor R9 at node N8, a second terminal of R9 is connected to a first terminal of resistor R10 at node N9, and a second terminal of R10 connects to ground. The resistor string operates as a standard voltage divider, wherein the voltages V0, V1, V2 and V3, generated at nodes N6, N7, N8 and N9, respectively, are determined as a function of the resistance values of the resistors R6, R7, R8, R9, R10, and the voltage across the resistor string, in this case VDD. Since the voltages generated by the reference source 210 are based primarily on respective ratios of the resistors in the resistor string, the voltages are substantially independent of process and temperature variations to which the resistors are subjected. As will be understood by those skilled in the art, the switching points of the comparators 202, 204, 206, 208 will be determined primarily by comparing the reference voltage Vref to respective voltages V0, V1, V2, and V3.

As previously stated, each of the resistor segments (e.g., R0 through R3 in FIG. 1) in a traditional compensated resistor circuit are typically made substantially equal to one another, so that the various switch points are equally spaced. However, this conventional approach does not yield an optimal resistance tolerance, due primarily to the inherent characteristics of the material from which the resistor is fabricated. For instance, assume that a sheet resistance of the material forming the resistor segments varies from a minimum value, $E_{lo}$, to a maximum value, $E_{hi}$, over PVT conditions to which the compensated resistor circuit may be subjected. If this range is divided into n intervals, the switch points for these n intervals will be $E0=E_{lo}$, E1, E2, E3, ..., $En=E_{hi}$, with each of the intervals having equally spaced widths of $(E_{hi}-E_{lo})/n$. Consider the kth interval that is bounded by switch points $E_{k-1}$ and $E_k$. The percentage (%) variation, which may be referred to as tolerance, for this interval can be determined as:

$$\%\text{Variation} = \frac{E_{hi} - E_{lo}}{2E_{lo} \cdot n + (E_{hi} - E_{lo})(2k-1)} \times 100 \quad (1)$$

As equation (1) above indicates, the percentage variation in the case of equally spaced intervals is a function of a position of the particular interval itself. The intervals toward the higher end of the sheet resistance variation tend to have a lower percentage variation than intervals toward the lower end of the sheet resistance variation. A worst case percentage variation, therefore, occurs at the first interval, k=1, and is given by the expression:

$$\text{Max.\%Variation} = \frac{E_{hi} - E_{lo}}{E_{hi} + (2n-1)E_{lo}} \times 100 \quad (2)$$

Thus, using equally spaced intervals does not yield tolerances that are equal across all resistance segments. Accordingly, more intervals will be required in order to meet a particular level of tolerance, thereby resulting in lower efficiency, compared to using a methodology that yields equal tolerances across all resistor segments.

The present invention, in an illustrative embodiment thereof, provides techniques for improving an efficiency of a resistance compensation circuit. Rather than employing equally spaced switched resistance intervals, as is traditionally done, geometrically varying interval widths are used so as to yield substantially equal resistance tolerances across all intervals. This can be accomplished, for example, by making the resistance intervals narrower toward a lower end of the variation range, where the tolerance would otherwise be larger, and making the resistance intervals wider toward a higher end of the range, where the tolerance would otherwise be smaller. Using the geometric interval spacing methodology of the present invention requires less intervals to meet a particular tolerance, thereby improving an efficiency of the resistance compensation circuit, and significantly reduces silicon area and circuit complexity compared to conventional resistance compensation schemes. The term "geometric" as used herein is intended to refer to a geometric progression, which is a sequence of numbers such that the quotient of any two successive members of the sequence is a constant, often called the common ratio of the sequence.

In accordance with one embodiment of the invention, the resistance variation range over PVT conditions is divided into a plurality of unequal intervals $U0=U_{lo}$, U1, U2, U3, ..., $Un=U_{hi}$, where n is the total number of intervals, Uk is a resistance of the kth interval, $U_{lo}$ is a minimum resistance of the variation range, and $U_{hi}$ is a maximum resistance of the variation range. The corresponding switch points vary geometrically, such that $$U1=U_{lo} \cdot R, \; U2=U_{lo} \cdot R^2, \; U3=U_{lo} \cdot R^3, \ldots,$$
$$Un=U_{hi}=U_{lo} \cdot R^n, \quad (3)$$

where R is a common ratio between the switch points, which can be determined as the nth root of $(U_{hi}/U_{lo})$. Preferably, R is greater than one so as to ensure that the width of the interval spacing decreases toward the lower end of the resistance range, and the width of the interval spacing increases toward the higher end of the resistance range. Using this spacing methodology yields a substantially constant percentage variation across each of the resistance intervals. This percentage variation may be expressed as $$\%\text{Variation} = \frac{R-1}{R+1} \times 100 \quad (4)$$

Using equation (4), the ratio R can be determined, for a given percentage resistance variation, as:

$$R = \frac{\left(1 + \frac{\%\text{Variation}}{100}\right)}{\left(1 - \frac{\%\text{Variation}}{100}\right)} \quad (5)$$

Solving for the number of intervals n using equation (3) above, the following expression can be derived:

$$n = \frac{ln(U_{hi}/U_{lo})}{ln(R)} \quad (6)$$

Thus, using equations (5) and (6) above, given a maximum resistance of the uncompensated variation, $U_{hi}$, and a minimum resistance of the uncompensated variation, $U_{lo}$, the number of resistance intervals n that are needed to achieve a desired tolerance in the compensated resistor circuit can be easily determined.

By way of example only, consider a compensated resistor circuit having a nominal resistance of 100 ohms and a ±30% uncompensated variation. The maximum resistance of the variation range will be $U_{hi}$=130 ohms, and the minimum resistance of the variation range will be $U_{lo}$=70 ohms. Using equation (5), the ratio R between the switch points in the termination resistor circuit for a 5% variation will be R=1.05/0.95=1.105. Plugging the values for $U_{hi}$, $U_{lo}$, and R into equation (6) above, the number of intervals required to achieve an effective 5% variation in the compensated resistor circuit is n=6.2, which is preferably rounded up to n=7 intervals. For the traditional approach, wherein equally spaced resistance intervals are employed, 9 intervals would be required.

Without loss of generality, consider an exemplary compensated termination resistor circuit having a nominal resistance of 1000 ohms, an uncompensated variation of ±30%, and a desired tolerance of ±3%. Using the techniques of the present invention described herein, $U_{hi}$=1300 ohms, $U_{lo}$=700 ohms, and the number of resistance intervals needed will be about n=10. Using equation (5) above, the ratio R is determined to be about 1.062. Table 1 below depicts the resistance intervals U0 through U9, as calculated using equation (3) above.

TABLE 1

| Interval | Resistance (Ohms) |
|---|---|
| U0 | 743.3 |
| U1 | 789.3 |
| U2 | 838.2 |
| U4 | 890.1 |
| U5 | 945.2 |
| U6 | 1003.7 |
| U7 | 1065.8 |
| U8 | 1131.8 |
| U9 | 1201.9 |

As apparent from Table 1 above, the widths of the respective intervals are not equal relative to one another. For instance, the width between intervals U0 and U1 is 46 ohms, while the width between intervals U8 and U9 is 70.1 ohms. The tolerance across each of the intervals is, however, substantially constant.

Figure 3:
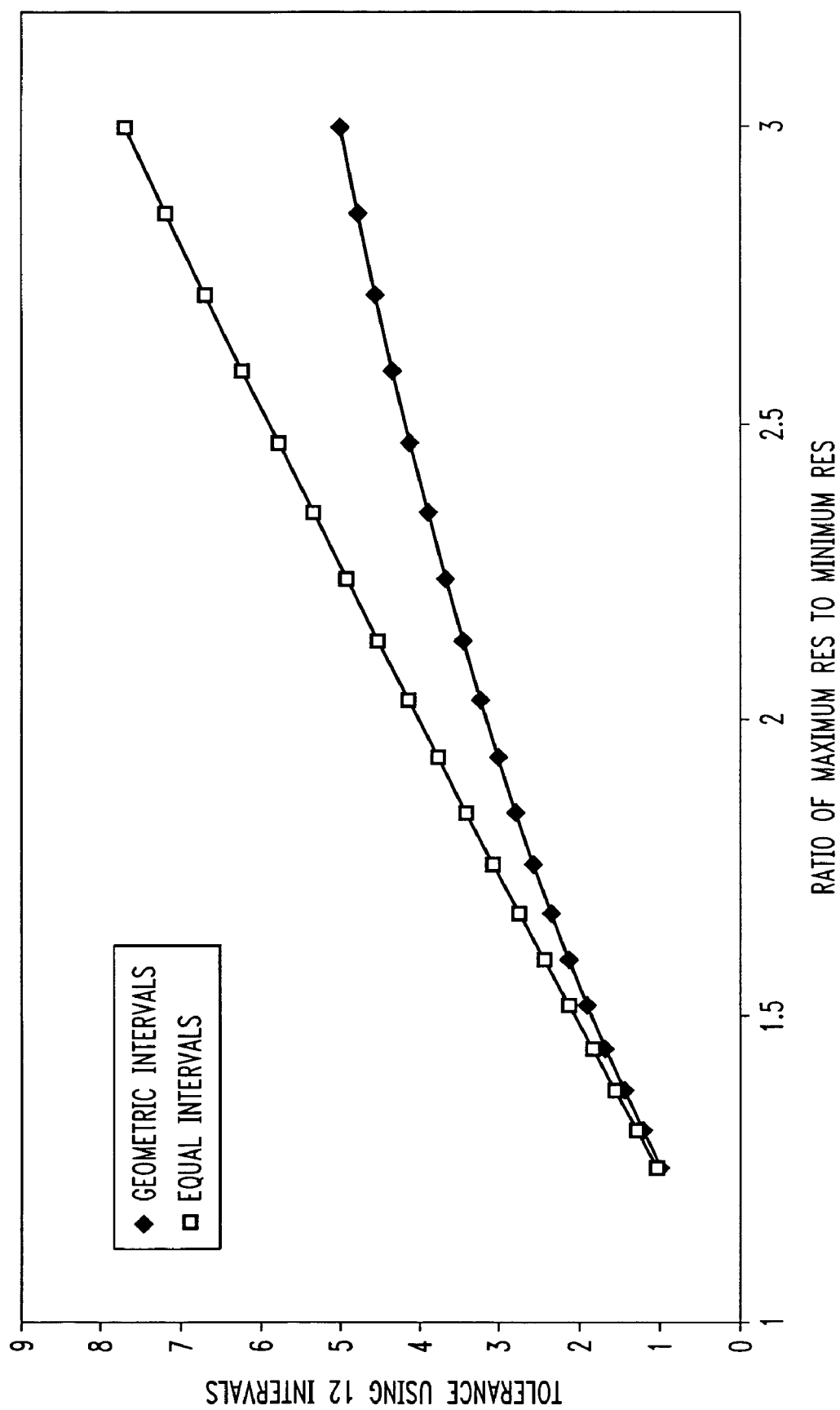
FIG. 3 is an exemplary graphical representation depicting percentage resistance tolerances for a compensated resistor circuit employing geometric intervals compared to a compensated resistor circuit employing equally spaced intervals, in accordance with one aspect of the present invention.

FIG. 3 is an exemplary graphical representation depicting percentage resistance variation for a compensated resistor employing geometric intervals, in accordance with one aspect of the invention, compared to a compensated resistor employing equally spaced intervals. As apparent from the figure, using twelve intervals (n=12) yields a tolerance of about 2.75% at a ratio of about 1.85, corresponding to an uncompensated variation of about ±30%. The tolerance using a traditional equal spacing approach would be about 3.4% under the same conditions. However, the reduction in tolerance using geometrically spaced resistance intervals compared to the conventional approach increases as the ratio between the maximum and minimum resistance values in the variation range increases. For example, for a ratio of about 3, the tolerance using the inventive methodology is about 5%, while the tolerance using the traditional approach is about 7.75% under the same conditions.

Figure 4:
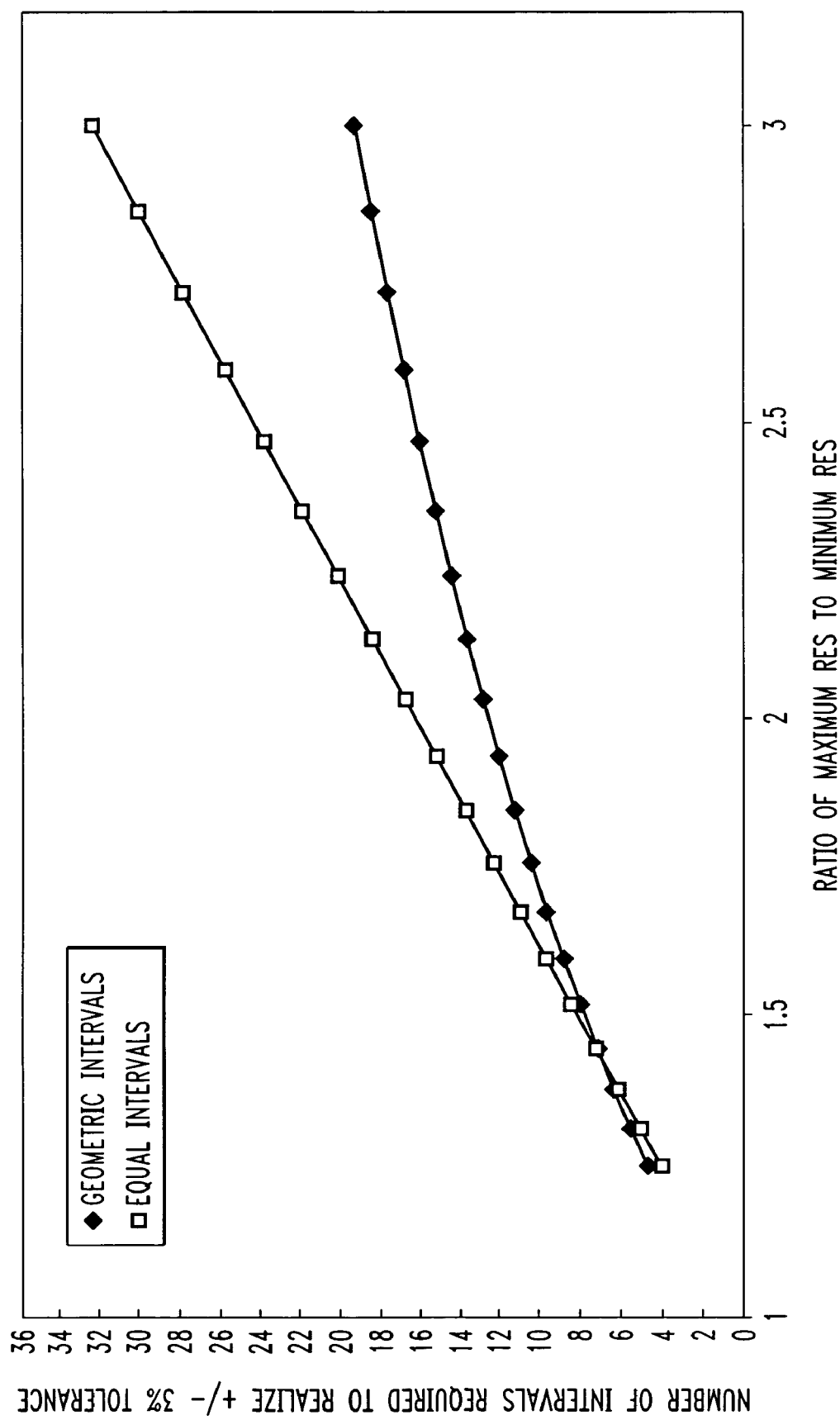
FIG. 4 is an exemplary graphical representation depicting the number of intervals required to realize a ±3 percent resistance tolerance for a compensated resistor circuit employing geometric resistance intervals compared to a compensated resistor circuit employing equally spaced resistance intervals, in accordance with another aspect of the present invention.

FIG. 4 is an exemplary graphical representation depicting the number of intervals required to realize a ±3% resistance variation for a compensated resistor employing geometric resistance intervals compared to a compensated resistor employing equally spaced resistance intervals, in accordance with another aspect of the present invention. As apparent from the figure, for a ratio between maximum and minimum resistance in the variation range that is less than about 1.5, the two methods require substantially the same number of intervals to achieve a ±3% tolerance, namely, about 8 intervals. However, as the ratio increases, the reduction in the number of required intervals using the geometric interval spacing increases significantly. For example, for a ratio of about 3, the number of resistance intervals required using the geometric spacing approach of the present invention is about 19, while the number of intervals required using equally spaced resistance intervals is about 33. This reduction in the number of intervals using geometrically spaced interval methodology significantly reduces the silicon area and complexity of the resistance compensation circuit compared to conventional resistance compensation approaches, and thus beneficially reduces cost.

At least a portion of the resistance compensation techniques of the present invention may be implemented in an integrated circuit. In forming integrated circuits, a plurality of identical die is typically fabricated in a repeated pattern on a surface of a semiconductor wafer. Each die includes a device described herein, and may include other structures or circuits. The individual die are cut or diced from the wafer, then packaged as an integrated circuit. One skilled in the art would know how to dice wafers and package die to produce integrated circuits. Integrated circuits so manufactured are considered part of this invention.

Although illustrative embodiments of the present invention have been described herein with reference to the accompanying drawings, it is to be understood that the invention is not limited to those precise embodiments, and that various other changes and modifications may be made therein by one skilled in the art without departing from the scope of the appended claims.

What is claimed is:

1. A semiconductor resistor circuit having a controllable resistance associated therewith, the resistor circuit comprising:

a plurality of resistor segments connected in at least one of a series and a parallel configuration; and a plurality of switches controlling connection of respective ones of the resistor segments to the resistor circuit, to thereby selectively control a resistance of the resistor circuit in response to respective control signals presented to the switches;

wherein the resistor circuit is selectively controllable in discrete resistance intervals, the resistance intervals being unequal to one another, the resistor segments having resistance values that are selected such that a percentage resistance variation across each of the respective resistance intervals as a function of at least one of process, voltage and temperature conditions to which the resistor circuit is subjected is substantially the same.

2. The circuit of claim 1, wherein the resistance values of the resistor segments are selected such that respective widths of the resistance intervals are geometrically spaced.

3. The circuit of claim 1, wherein the resistor circuit is selectively controllable from a first resistance, $U_{lo}$, to a second resistance, $U_{hi}$, in discrete geometrically spaced intervals of resistance, the second resistance being greater than the first resistance, a resistance value of a kth interval being substantially equal to $U_{lo} \times R^k$, where R is a common ratio between intervals and is substantially equal to an nth root of $U_{hi}$ divided by $U_{lo}$, where n is a total number of resistance intervals in the resistor circuit.

4. The circuit of claim 1, wherein the resistor circuit is selectively controllable from a first resistance, $U_{lo}$, to a second resistance, $U_{hi}$, in discrete geometrically spaced intervals of resistance, the second resistance being greater than the first resistance, a total number of intervals, n, in the resistor circuit being determined according to an expression $$n = \frac{\ln(U_{hi}/U_{lo})}{\ln(R)},$$

where R is determined, for a given percentage resistance variation, V, of the resistor circuit, according to an expression $$R = \frac{\left(1 + \frac{V}{100}\right)}{\left(1 - \frac{V}{100}\right)}.$$

5. The circuit of claim 1, further comprising a voltage generator circuit operative to generate the control signals for selectively controlling the resistance of the resistor circuit as a function of at least one of process, voltage and temperature conditions to which the resistor circuit is subjected.

6. The circuit of claim 5, wherein the voltage generator circuit comprises:

a plurality of comparators, each comparator receiving at least a first input signal which varies as a function of the at least one of process, voltage and temperature conditions, and a second signal which is substantially constant, and generating a given one of the control signals for controlling a respective one of the switches.

7. The circuit of claim 5, wherein the voltage generator circuit comprises:

a current source generating a substantially constant current;

a monitor resistor coupled to the current source, a reference voltage being generated across the monitor resistor which varies as a function of the at least one of process, voltage and temperature conditions;

a reference source operative to generate a plurality of substantially constant voltages, each of the voltages corresponding to a desired switching point of a respective one of the switches in the resistor circuit; and a plurality of comparators, each comparator receiving at least the reference voltage and a given one of the voltages generated by the reference source, and generating a given one of the control signals for controlling a respective one of the switches.

8. The circuit of claim 7, wherein the monitor resistor is substantially matched to the plurality of resistor segments.

9. The circuit of claim 5, wherein the switching points of the control signals are configured to be proportional to the respective resistance intervals corresponding thereto.

10. The circuit of claim 1, wherein the control signals comprise a plurality of digital bits, each bit corresponding to a given one of the switches, the bits forming a digital code word which is indicative of an amount of at least one of process, voltage and temperature variation in the resistor circuit.

11. The circuit of claim 10, wherein the digital code word comprises at least one of a binary code word and a thermometer code word.

12. An integrated circuit including at least one resistor circuit having a controllable resistance associated therewith, the at least one resistor circuit comprising:

a plurality of resistor segments connected in at least one of a series and a parallel configuration; and a plurality of switches controlling connection of respective ones of the resistor segments to the resistor circuit, to thereby selectively control a resistance of the resistor circuit in response to respective control signals presented to the switches;

wherein the resistor circuit is selectively controllable in discrete resistance intervals, the resistance intervals being unequal to one another, the resistor segments having resistance values that are selected such that a percentage resistance variation across each of the respective resistance intervals as a function of at least one of process, voltage and temperature conditions to which the resistor circuit is subjected is substantially the same.

13. The integrated circuit of claim 12, wherein the resistance values of the resistor segments are selected such that respective widths of the intervals are geometrically spaced.

14. The integrated circuit of claim 12, wherein the at least one resistor circuit is selectively controllable from a first resistance, $U_{lo}$, to a second resistance, $U_{hi}$, in discrete geometrically spaced intervals of resistance, the second resistance being greater than the first resistance, a resistance value of a kth interval being substantially equal to $U_{lo} \times R^k$, where R is a common ratio between intervals and is substantially equal to an nth root of $U_{hi}$ divided by $U_{lo}$, where n is a total number of intervals in the resistor circuit.

15. The integrated circuit of claim 12, wherein the at least one resistor circuit is selectively controllable from a first resistance, $U_{lo}$, to a second resistance, $U_{hi}$, in discrete geometrically spaced intervals of resistance, the second resistance being greater than the first resistance, a total number of intervals, n, in the at least one resistor circuit being determined according to an expression $$n = \frac{\ln(U_{hi}/U_{lo})}{\ln(R)},$$

where R is determined, for a given percentage resistance variation, V, of the at least one resistor circuit, according to an expression $$R = \frac{\left(1 + \frac{V}{100}\right)}{\left(1 - \frac{V}{100}\right)}.$$

16. The integrated circuit of claim 12, further comprising a voltage generator circuit operative to generate the control signals for selectively controlling the resistance of the resistor circuit as a function of at least one of process, voltage and temperature conditions to which the at least one resistor circuit is subjected.

17. The integrated circuit of claim 16, wherein the voltage generator circuit comprises:
a plurality of comparators, each comparator receiving at least a first input signal which varies as a function of the at least one of process, voltage and temperature conditions, and a second signal which is substantially constant, and generating a given one of the control signals for controlling a respective one of the switches.

18. The integrated circuit of claim 16, wherein the voltage generator circuit comprises:
a current source generating a substantially constant current;
a monitor resistor coupled to the current source, a reference voltage being generated across the monitor resistor which varies as a function of the at least one of process, voltage and temperature conditions;
a reference source operative to generate a plurality of substantially constant voltages, each of the voltages corresponding to a desired switching point of a respective one of the switches in the resistor circuit; and
a plurality of comparators, each comparator receiving at least the reference voltage and a given one of the voltages generated by the reference source, and generating a given one of the control signals for controlling a respective one of the switches.

19. The integrated circuit of claim 12, wherein the control signals comprise a plurality of digital bits, each bit corresponding to a given one of the switches, the bits forming a digital code word which is indicative of an amount of at least one of process, voltage and temperature variation in the resistor circuit.

20. The integrated circuit of claim 19, wherein the digital code word comprises at least one of a binary code word and a thermometer code word.

* * * * *